(12) United States Patent
Kawai

(10) Patent No.: US 8,284,093 B2
(45) Date of Patent: Oct. 9, 2012

(54) SUCCESSIVE APPROXIMATION A/D CONVERTER

(75) Inventor: Hirotaka Kawai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 28 days.

(21) Appl. No.: 12/928,122

(22) Filed: Dec. 3, 2010

(65) Prior Publication Data

US 2011/0133963 A1 Jun. 9, 2011

(30) Foreign Application Priority Data

Dec. 4, 2009 (JP) ................................. 2009-276739

(51) Int. Cl.
*H03M 1/12* (2006.01)
(52) U.S. Cl. ......... 341/172; 341/155; 341/161; 341/162
(58) Field of Classification Search .................. 341/162, 341/155, 172, 161
See application file for complete search history.

(56) References Cited

U.S. PATENT DOCUMENTS

| | | | |
|---|---|---|---|
| 4,907,002 A | | 3/1990 | Kawada |
| 6,380,881 B2 * | | 4/2002 | Harada et al. ................. 341/165 |
| 7,265,708 B2 * | | 9/2007 | Mitra et al. ................... 341/172 |
| 2005/0200510 A1 * | | 9/2005 | Yoshida et al. ............... 341/155 |
| 2007/0035434 A1 * | | 2/2007 | Tachibana et al. ............ 341/161 |
| 2008/0143576 A1 * | | 6/2008 | Chen et al. .................... 341/162 |

FOREIGN PATENT DOCUMENTS

| | | |
|---|---|---|
| JP | 64-030331 | 2/1989 |
| JP | 7336224 | 12/1995 |

* cited by examiner

*Primary Examiner* — Jean B JeanGlaude
(74) *Attorney, Agent, or Firm* — Pillsbury Winthrop Shaw Pittman LLP

(57) ABSTRACT

A successive approximation A/D converter, includes a reference voltage generation circuit, a sample/hold circuit, a D/A converter circuit, a comparator, and a control circuit. A potential difference between the comparison target voltage generated by the D/A converter circuit and the internal analog voltage is applied to one input terminal of the comparator through a first signal line, and the reference voltage generation circuit is connected to the other input terminal of the comparator through a second signal line and a switch. Capacitive elements are disposed between the high potential power supply and the second signal line, and between the second signal line and the low potential power supply, respectively. The control circuit turns ON the switch to charge the first and second capacitive elements during a period when the sample/hold circuit samples and holds the internal analog voltage and turns OFF the switch in response to end of the period.

4 Claims, 5 Drawing Sheets

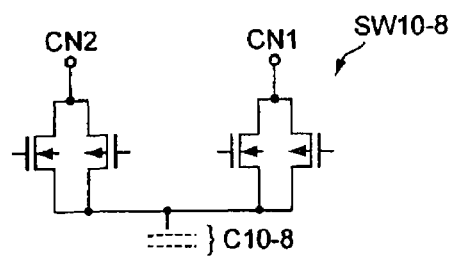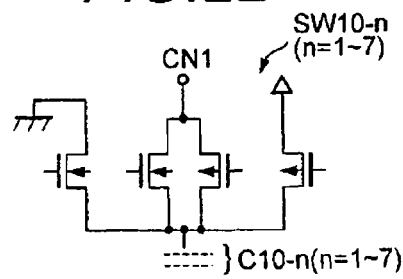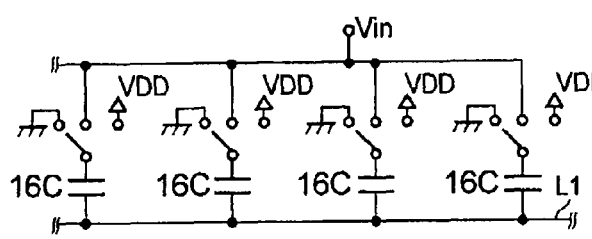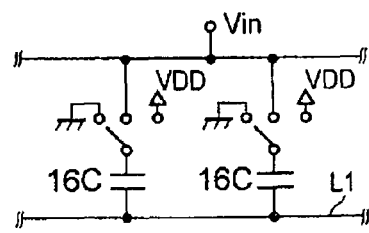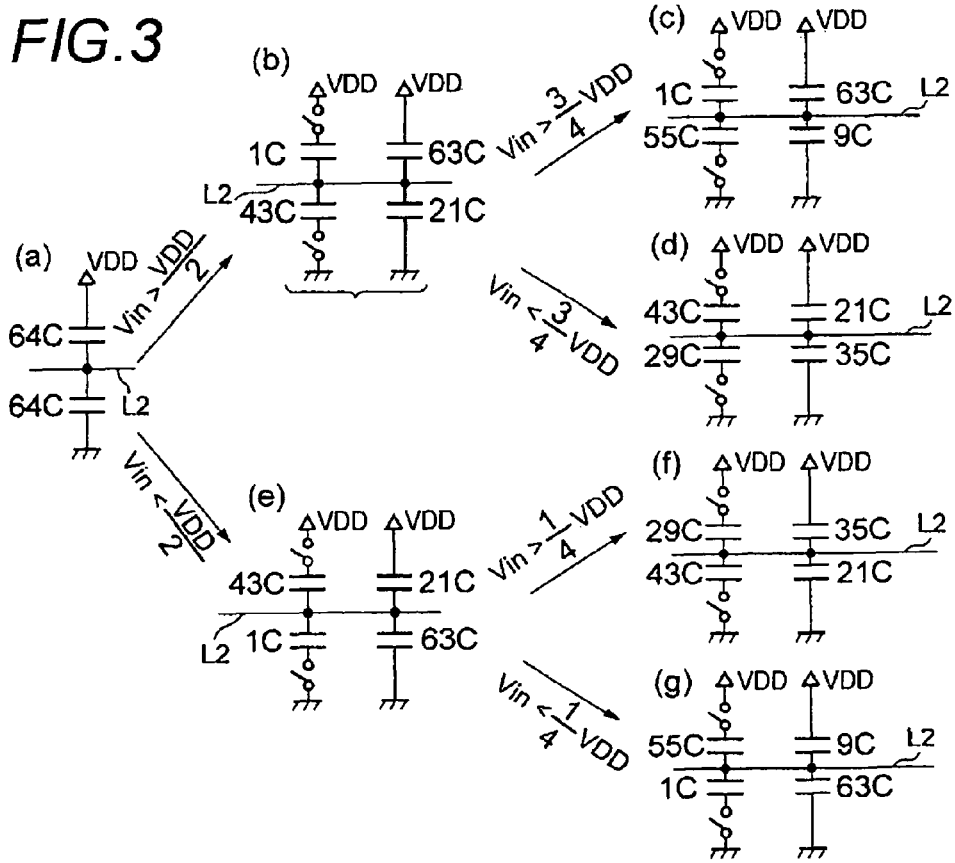

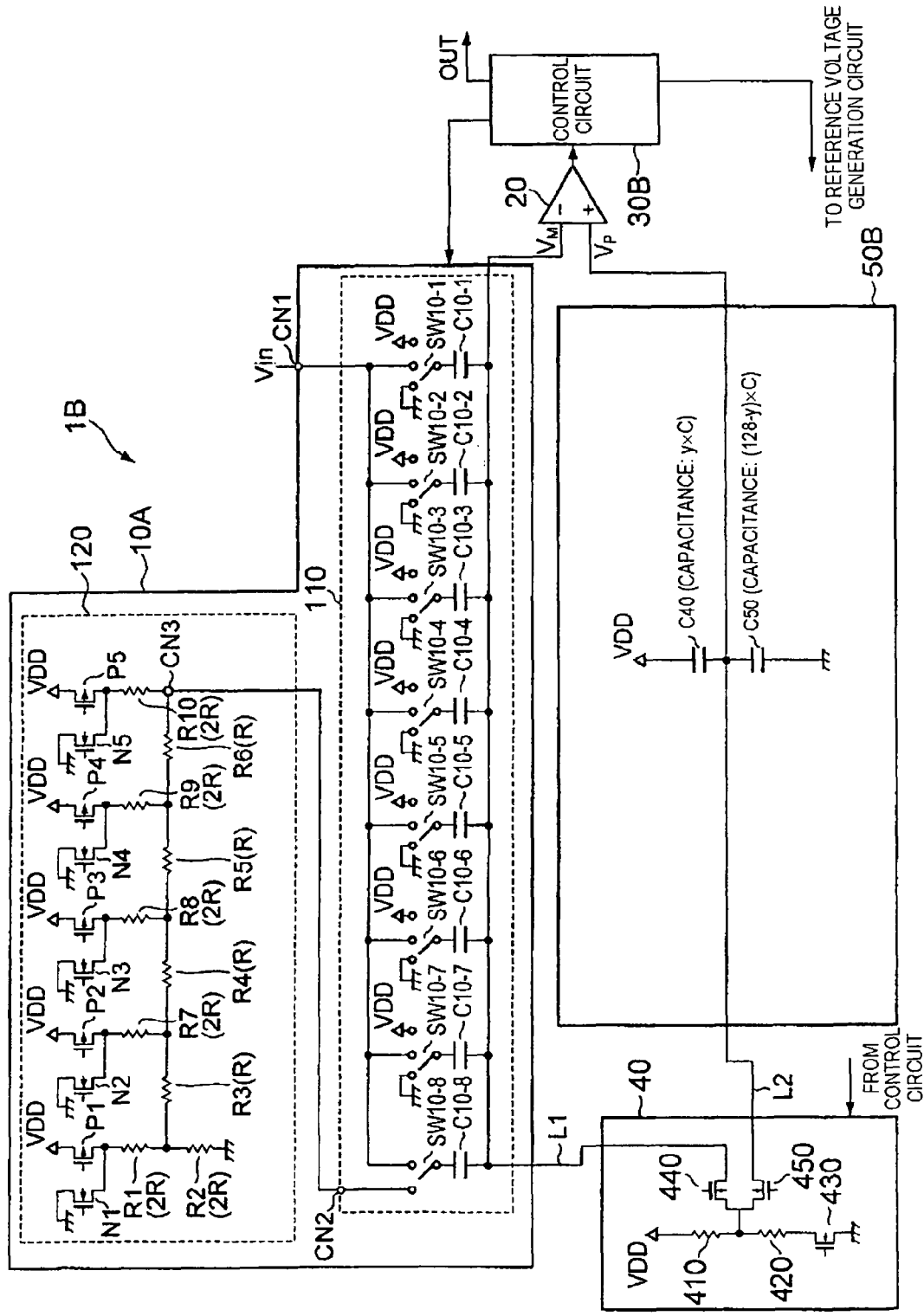

PRIOR ART great, 

SUCCESSIVE APPROXIMATION A/D CONVERTER

BACKGROUND OF THE INVENTION

1. Technical Field

The present invention relates to an A/D converter that converts an analog signal to digital data, and more particularly, to a successive approximation A/D converter.

2. Background Art

Successive approximation A/D converters sequentially compare the magnitudes of an input analog voltage with voltages (hereinafter, comparison target voltages) corresponding to ½, ¼ (or ¾) of a power supply voltage VDD to specify a comparison target voltage that is closest to the input analog voltage and output digital data representing the comparison target voltage. Successive approximation A/D converters are classified into a resistance division-type A/D converter, a charge redistribution-type A/D converter, and an A/D converter using the two types depending on a configuration of a circuit that generates comparison target voltages. It is generally difficult with the resistance division-type A/D converter to realize a resolution of 8 bits or higher. When it is necessary to realize a resolution of 8 bits or higher, a charge redistribution-type A/D converter or an A/D converter using both the resistance division type and the charge redistribution type is often used. JP-A-7-336224 and JP-B-7-34541 are examples of related art documents regarding a charge redistribution-type successive approximation A/D converter.

FIG. 5 shows a configuration example of a charge redistribution-type successive approximation A/D converter.

A comparator 20 compares the magnitudes of an input analog voltage $V_{in}$ with a comparison target voltage. A reference voltage generation circuit 40 generates a reference voltage $V_{ref}$ (VDD/2 is used in the example of FIG. 5) used in the comparison by dividing a potential difference between a high potential power supply (a power supply generating an operation voltage VDD of the successive approximation A/D converter) and a low potential power supply (the ground) and supplies the reference voltage $V_{ref}$ to the comparator 20. A control circuit 30 includes an n-bit successive approximation register (not shown) and sets "10 . . . 0" (n-bit data of which only the MSB (Most Significant Bit) is 1 and the other bits are 0) to the successive approximation register as an initial value. The control circuit 30 causes a local D/A converter circuit 10 to generate a comparison target voltage corresponding to the content stored in the successive approximation register and updates the content stored in the successive approximation register with "11 . . . 0" or "01 . . . 0" in accordance with an output signal from the comparator 20. When the bit value of the LSB (Least Significant Bit) of the successive approximation register is determined, the control circuit 30 outputs the content stored in the successive approximation register as digital data which is the result of conversion.

The local D/A converter circuit 10 of FIG. 5 has capacitive elements $C_0, C_1, C_2, C_{n-2}, C_{n-1}$, and $C_n$ which form a binary-weighted capacitor array. Where n=4 and a unit capacitance is C, the capacitances of the capacitive elements $C_0, C_1, C_2, C_3$, and $C_4$ are C/8, C/8, C/4, C/2, and C, respectively. In the successive approximation A/D converter shown in FIG. 5, the control circuit 30 first causes switches $SW_0, SW_1, SW_2, SW_3$, and $SW_4$ to be switched to an input terminal side (a terminal to which the input analog voltage $V_{in}$ is input) to turn ON a switch 12. In this state, the reference voltage $V_{ref}$ is applied to a common connection terminal of the capacitive elements $C_0$ to $C_4$, and an electric charge corresponding to the potential difference between the input analog voltage $V_{in}$ and the reference voltage $V_{ref}$ is accumulated in the capacitive elements $C_0$ to $C_4$ (see FIG. 6A). A total electric charge $Q_T$ accumulated in the capacitive elements $C_0$ to $C_4$ in the state shown in FIG. 6A is expressed by Equation 1 below.

$$Q_T = \{V_{in} - V_{ref}\} \times 2C \quad (1)$$
$$= \{V_{in} - VDD/2\} \times 2C$$

In the state shown in FIG. 6A, when the switch 12 is turned OFF, the total electric charge $Q_T$ accumulated in the capacitive elements $C_0$ to $C_4$ is maintained. That is, the local D/A converter circuit 10 functions as a sample/hold circuit that converts the input analog voltage $V_{in}$ to a potential difference "$V_{in}$-$V_{ref}$" (hereinafter referred to as an internal analog voltage) between the input analog voltage $V_{in}$ and the reference voltage $V_{ref}$ and holds the potential difference. Moreover, the local D/A converter circuit 10 has a function of generating various comparison target voltages under the control of the control circuit 30. In the successive approximation A/D converter shown in FIG. 5, successive comparison with various comparison target voltages is performed by opening the switch 12 to sequentially convert the switches $SW_0$ to $SW_4$. Conversion of these switches $SW_O$ to $SW_4$ is performed in accordance with the content stored in the successive approximation register. Specifically, where the LSB of the successive approximation register is the 0-th bit and the MSB is the n-th bit, the control circuit 30 causes a switch $SW_k$ to be switched to the high potential power supply side if the bit value of the k-th bit (k=0 to n) is 1 and converts the switch $SW_k$ to the low potential power supply side if the bit value of the same k-th bit is 0.

In this way, at the start time of the successive comparison operation, "10000" is stored in the successive approximation register. Therefore, the control circuit 30 causes the switch $SW_4$ to be switched to the high potential power supply side and causes the switches $SW_0$ to $SW_3$ to be switched to the low potential power supply side. As a result, as shown in FIG. 6B, the capacitive element $C_4$ is disposed between the high potential power supply and a signal line L1, and the capacitive elements $C_0$ to $C_3$ are disposed in parallel between the signal line L1 and the low potential power supply. In the state shown in FIG. 6B, a voltage $V_M$ input to a minus-side input terminal of the comparator 20 is expressed by Equation 2 below, considering the fact that the law of conservation of charge (−C×(VDD−VM)+$CV_M$=−2C×($V_{in}$−VDD/2)) is applied to the electric charge accumulated in the electrode connected to the signal line L1.

$$V_M = VDD - V_{in} \quad (2)$$
$$= VDD/2 - (V_{in} - VDD/2)$$

The comparator 20 compares the magnitudes of the voltage $V_M$ shown in Equation 2 and a voltage $V_p$ input to the plus-side input terminal thereof and outputs a signal corresponding to the result of the comparison. As shown in FIG. 5, since $V_p$=$V_{ref}$(=VDD/2), comparing the magnitudes of $V_P$ and $V_M$ is equivalent to comparing the magnitudes of $V_{in}$ and VDD/2. If $V_{in}$≧VDD/2, then $V_M$≦$V_p$ and a High level signal ("1") is supplied from the comparator 20 to the control circuit 30. This means that MSB is 1. On the other hand, if $V_{in}$<VDD/2, then $V_M > V_P$ and a Low level signal ("0") is supplied from the comparator 20 to the control circuit 30. This means that MSB is 0.

When the bit value of the MSB is determined in this way, the control circuit 30 determines the bit value of 2SB (Second Significant Bit) which is the next bit in the following manner. For example, if the MSB is determined to be "1," the control circuit 30 updates the content stored in the successive approximation register with "11000" and causes the switches $SW_0$ to $SW_4$ to be switched in accordance with the content stored in the successive approximation register. Specifically, in addition to the switch $SW_4$, the switch $SW_3$ is switched to the high potential power supply side. As a result, as shown in FIG. 6C, the capacitive elements $C_4$ and $C_3$ are disposed in parallel between the high potential power supply and the signal line L1, and the capacitive elements $C_0$ to $C_2$ are disposed in parallel between the signal line L1 and the low potential power supply. As described above, considering the fact that the law of conservation of charge is applied to the electric charge accumulated in the electrode connected to the signal line L1, the voltage $V_M$ appearing on the signal line L1 is expressed by $V_M = VDD/2 - \{V_{in} - (3/4) \times VDD\}$. The comparator 20 compares the magnitudes of the voltage $V_M$ and the voltage $V_P = VDD/2$, and the 2SB is determined in accordance with the magnitude relationship between them (in other words, the magnitude relationship between $V_{in}$ and $(3/4) \times VDD$). If the MSB is determined to be "0," the content stored in the successive approximation register is "01000." Therefore, the switch $SW_4$ is switched to the low potential power supply side, and the switch $SW_3$ is switched to the high potential power supply side. As a result, as shown in FIG. 6D, the capacitive element $C_3$ is disposed between the high potential power supply and the signal line L1, and the capacitive elements $C_4$ and $C_0$ to $C_2$ are disposed in parallel between the signal line L1 and the low potential power supply. In the state shown in FIG. 6D, $V_M = VDD/2 - \{V_{in} - (1/4) \times VDD\}$. Similarly, thereafter, 3SB (Third Significant Bit), . . . , and LSB are sequentially determined.

In recent years, there is a need for using a switching power supply and a DC/DC converter as a power supply that supplies a reference voltage VDD and suppresses the output voltage thereof to be low. However, since the output voltage of this kind of power supply contains a ripple component, when the output voltage is low, there is a problem in that the A/D conversion accuracy decreases greatly due to the fluctuation thereof. The reasons for this are as follows. It will be assumed that the output voltage of the high potential power supply is changed from VDD to VDD+ΔV when comparing the magnitude of the input analog voltage $V_{in}$ and the comparison target voltages. In this case, although a fluctuation component of the voltage input to the plus-side input terminal of the comparator 20 is ΔV/2 regardless of the comparison target voltage, a fluctuation component contained in the voltage input to the minus-side input terminal thereof is different for each comparison target voltage. For example, the fluctuation component is ΔV/2 when the comparison target voltage is VDD/2 (namely, when determining the bit value of the MSB), and the fluctuation component is ΔV/4 or ΔV×(3/4) when the comparison target voltage is VDD/4 or VDD×(3/4) (namely, when determining the bit value of the 2SB). Therefore, if the power supply voltage fluctuates when determining the bit value of the bits other than the MSB, the magnitude relationship between the comparison target voltage and the input analog voltage $V_{in}$ is not determined correctly. Thus, the A/D conversion accuracy decreases.

SUMMARY OF THE INVENTION

The present invention has been made in view of the problems outlined above, and an object thereof is to provide a successive approximation A/D converter in which a power supply the output voltage of which fluctuates is used as a reference voltage generation source, and which is hardly affected by fluctuation of the output voltage even when the output voltage is suppressed to be low.

In order to achieve the problem, the present invention provides a successive approximation A/D converter, comprising: a reference voltage generation circuit that divides a potential difference between a high potential power supply and low potential power supply to output a reference voltage; a sample/hold circuit that converts an input analog voltage to an internal analog voltage representing a difference between the input analog voltage and the reference voltage, and samples and holds the internal analog voltage; a D/A converter circuit that divides a potential difference between the high potential power supply and the low potential power supply to generate a comparison target voltage; a comparator that compares the input analog voltage with the comparison target voltage and outputs a signal representing the result of the comparison; and a control circuit that retrieves a comparison target voltage that is closest to the input analog voltage while successively updating a voltage division ratio in the D/A converter circuit in accordance with the output signal from the comparator and outputs a digital value corresponding to the result of the retrieval, wherein a potential difference between the comparison target voltage generated by the D/A converter circuit and the internal analog voltage is applied to one input terminal of the comparator through a first signal line, and the reference voltage generation circuit is connected to the other input terminal of the comparator through a second signal line and a switch, a first capacitive element is disposed between the high potential power supply and the second signal line, and a second capacitive element is disposed between the second signal line and the low potential power supply, and the control circuit turns ON the switch to charge the first and second capacitive elements during a period when the sample/hold circuit samples and holds the internal analog voltage and turns OFF the switch in response to end of the period.

In the successive approximation A/D converter, if the capacitances of the first and second capacitive elements are determined so that the impedances of the first and second signal lines are uniform with each other, even when the output voltage of the high potential power supply fluctuates, the amounts of fluctuation in the voltages input to the comparator through the first and second signal lines will be identical to each other. Moreover, the fluctuation components will be canceled by the comparator which is a differential amplifier, and will have no influence on the result of the A/D conversion.

In another aspect, the successive approximation A/D converter may be configured in that both the first and second capacitive elements are variable capacitive elements, and the control circuit adjusts the capacitances of the first and second capacitive elements so that a voltage division ratio determined by the first and second capacitive elements is uniform with a voltage division ratio used when the D/A converter circuit generates the comparison target voltage. In still another aspect, the successive approximation A/D converter may be configured in that the capacitances of the first and second capacitive elements are predetermined in advance so that a voltage division ratio determined by the first and second capacitive elements is uniform with a voltage division ratio used when the D/A converter circuit generates a predetermined comparison target voltage.

According to the former aspect, although it is necessary to perform a complicated control (and to have a configuration for realizing such a control) of adjusting the capacitances of the first and second capacitive elements in synchronism with a successive comparison operation, it is advantageous in that the influence of fluctuation of the output voltage of the high potential power supply can always be eliminated regardless of the signal value of the input analog signal. On the other hand, according to the latter aspect, although the influence of fluctuation of the output voltage of the high potential power supply can be eliminated only when the signal value of the input analog signal has a value corresponding to a specific code or a near value thereof, it is advantageous in that the configuration can be simplified compared to the former aspect.

The successive approximation A/D converter may be configured in that the first and second capacitive elements comprise a plurality of capacitive elements that are connected to respective switches, and the control circuit adjusts the capacitances of the first and second capacitive elements by switching the respective switches connected to the plurality of capacitive elements in synchronism with a successive comparison operation of the D/A converter circuit. The successive approximation A/D converter may be configured in that the first and second capacitive elements comprise a plurality of capacitive elements that are connected to respective switches, each capacitance of the plurality of capacitive elements being different from one another, and the control circuit adjusts total capacitances of the first and second capacitive elements by switching the respective switches connected to the plurality of capacitive elements.

BRIEF DESCRIPTION OF THE DRAWINGS

In the accompanying drawings:

FIGS. 2A to 2D show a detailed configuration example of each unit of the A/D converter 1A;

FIG. 3 illustrates the operation of the A/D converter 1A;

FIG. 4 shows a configuration example of an A/D converter 1B according to a second embodiment of the present invention;

DETAILED DESCRIPTION OF THE EXEMPLARY EMBODIMENTS

Hereinafter, embodiments of the present invention will be described with reference to the drawings.

A: First Embodiment

Figure 1:
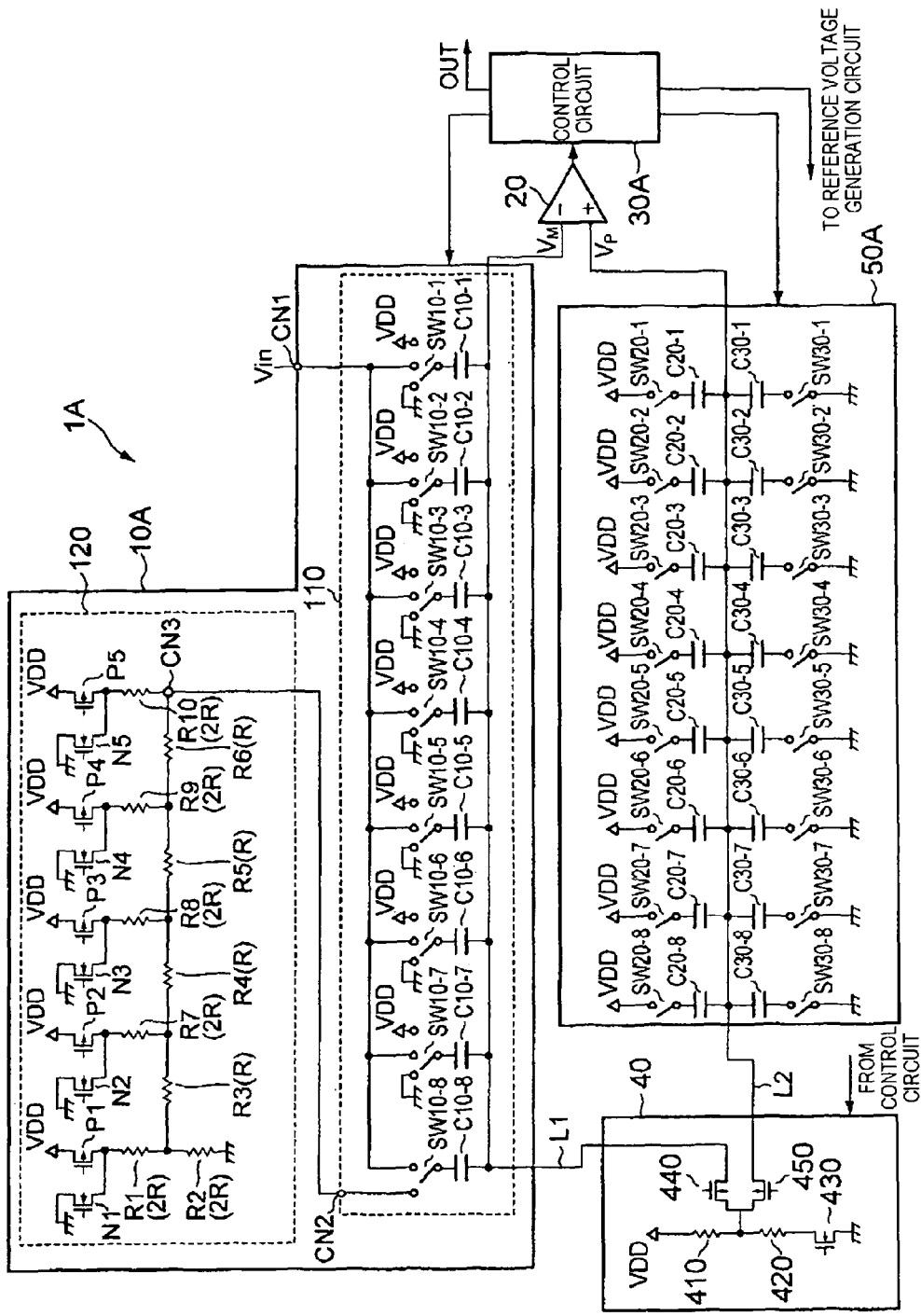
FIG. 1 shows a configuration example of an A/D converter 1A according to a first embodiment of the present invention.

FIG. 1 is a block diagram showing a configuration example of an A/D converter 1A according to a first embodiment of the present invention.

The A/D converter 1A is a successive approximation A/D converter that converts an input analog voltage $V_{in}$ to 12-bit digital data OUT and outputs the data OUT. As shown in FIG. 1, the A/D converter 1A includes a local D/A converter circuit 10A, a comparator 20, a control circuit 30A, a reference voltage generation circuit 40, and a reference voltage adjustment circuit 50A.

Figure 5:
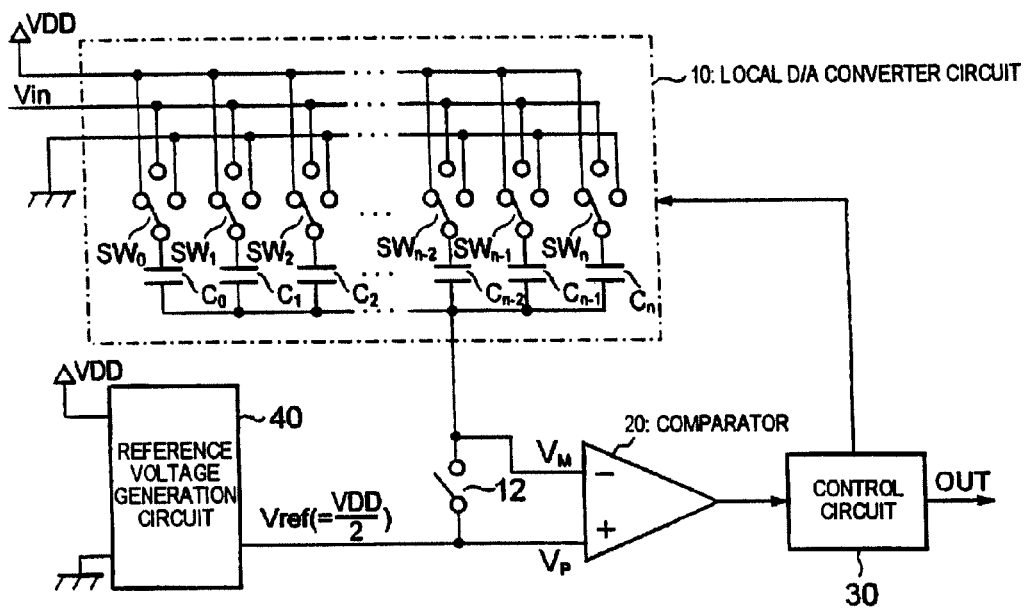
FIG. 5 shows a configuration example of a conventional successive approximation A/D converter.

The function and configuration of the reference voltage generation circuit 40 are basically the same as those of a conventional successive approximation A/D converter (see FIG. 5). As shown in FIG. 1, the reference voltage generation circuit 40 is a voltage divider circuit in which resistors 410 and 420 and an N-channel field-effect transistor 430 are disposed in series between a high potential power supply that outputs a positive voltage VDD and a low potential power supply (in the present embodiment, the ground). The resistors 410 and 420 are resistance elements having the same resistance value. Therefore, when the N-channel field-effect transistor 430 is turned ON, the potential at the common connection point of the resistors 410 and 420 is VDD/2. As shown in FIG. 1, a signal line L1 is connected to the common connection point of the resistors 410 and 420 via an N-channel field-effect transistor 440, and a signal line L2 is connected to the common connection point of the resistors 410 and 420 via an N-channel field-effect transistor 450. Therefore, when all the N-channel field-effect transistors 430, 440, and 450 are turned ON, the voltage (VDD/2) of the common connection point of the resistors 410 and 420 appears on the signal lines L1 and L2. The ON/OFF control of these three N-channel field-effect transistors is performed by the control circuit 30A. As shown in FIG. 1, the signal line L1 is connected to the minus-side input terminal of the comparator 20 through the local D/A converter circuit 10A, and the signal line L2 is connected to the plus-side input terminal of the comparator 20 through the reference voltage adjustment circuit 50A.

The local D/A converter circuit 10A includes an upper 7-bit conversion circuit 110, which is a charge redistribution-type circuit, and a lower 5-bit conversion circuit 120, which is a resistance division-type circuit (in the present embodiment, an R-2R-type ladder circuit). That is, the A/D converter 1A generates comparison target voltages using both a charge redistribution-type circuit and a resistance division-type circuit. Hereinafter, the brief configuration of the upper 7-bit conversion circuit 110 and the lower 5-bit conversion circuit 120 will be described.

As shown in FIG. 1, the upper 7-bit conversion circuit 110 includes a plurality of capacitive elements C10-n (n=1 to 8) each having one electrode connected to the signal line L1. The other electrode (that is, the electrode not connected to the signal line L1) of the capacitive element C10-8 is connected to a switch SW10-8. As shown in FIG. 1, the switch SW10-8 selectively connects the other electrode of the capacitive element C10-8 to any one of an analog input terminal CN1 to which the input analog voltage $V_{in}$ is input and an input terminal CN2 to which the lower 5-bit conversion circuit 120 is connected. The switch SW10-8 may have a specific configuration as shown in FIG. 2A in which N-channel and P-channel field-effect transistors are disposed in parallel between the other electrode described above and the input terminal CN2, and N-channel and P-channel field-effect transistors are disposed in parallel between the other electrode described above and the analog input terminal CN1.

The other electrodes (that is, electrodes not connected to the signal line L1) of the capacitive elements C10-n (n=1 to 7) are connected to switches SW10-n (n=1 to 7), respectively. As shown in FIG. 1, the switches SW10-n (n=1 to 7) selectively connect the other electrodes of the capacitive elements C10-n (n=1 to 7) to any one of the high potential power supply and the low potential power supply. The switches SW10-n (n=1 to 7) may have a specific configuration as shown in FIG. 2B, in which N-channel and P-channel field-effect transistors are disposed in parallel between the other electrode described above and the input terminal CN1, a P-channel field-effect transistor is disposed between the other electrode described above and the high potential power supply, and a N-channel field-effect transistor is disposed between the other electrode described above and the low potential power supply.

When a unit capacitance (hereinafter denoted as "1C") is 0.1 pF (picofarad), the capacitances of the capacitive elements C10-n (n=1 to 8) are set to be binary-weighted as follows. That is, the capacitance of the capacitive element C10-1 is 64C; the capacitance of the capacitive element C10-2 is 32C; the capacitance of the capacitive element C10-3 is 16C; the capacitance of the capacitive element C10-4 is 8C; the capacitance of the capacitive element C10-5 is 4C; the capacitance of the capacitive element C10-6 is 2C; and the capacitances of the capacitive elements C10-7 and C10-8 are 1C. Therefore, the total capacitance of the capacitive elements C10-n (n=1 to 8) is 128C (=12.8 pF). Although the detailed configuration is not illustrated in detail in FIG. 1, the capacitive element C10-1 has a configuration in which four 16C capacitive elements are connected in parallel as shown in FIG. 2C, and the capacitive element C10-2 has a configuration in which two 16C capacitive elements are connected in parallel as shown in FIG. 2D. Moreover, these capacitive elements C10-1 and C10-2 may be configured by a single capacitive element.

As shown in FIG. 1, the lower 5-bit conversion circuit 120 includes 2R resistors R1, R2, and R7 to R10, and 1R resistors R3 to R6, N-channel field-effect transistors N1 to N5, and P-channel field-effect transistors P1 to P5. As shown in FIG. 1, the P-channel field-effect transistor P1 and the resistors R1 and R2 are disposed in series between the high potential power supply and the low potential power supply, and the common connection point of the P-channel field-effect transistor P1 and the resistor R1 is connected to the low potential power supply through the N-channel field-effect transistor N1. The resistors R3, R4, R5, and R6 are disposed in series between the common connection point of the resistors R1 and R2 and an output terminal CN3 of the lower 5-bit conversion circuit 120. Each common connection point (n=2 to 4) of the resistors Rn+1 and Rn+2 is connected to the high potential power supply through the resistor Rn+5 and the P-channel field-effect transistor Pn, and the common connection point of the resistor Rn+5 and the P-channel field-effect transistor Pn is connected to the low potential power supply through the N-channel field-effect transistor Nn. Moreover, the output terminal CN3 is connected to the high potential power supply through the resistor R10 and the P-channel field-effect transistor P5, and the common connection point of the resistor R10 and the P-channel field-effect transistor P5 is connected to the low potential power supply through the N-channel field-effect transistor N5.

Due to such a configuration, in the lower 5-bit conversion circuit 120, by switching ON/OFF the N-channel field-effect transistors N1 to N5 and the P-channel field-effect transistors P1 to P5, the output voltage thereof is adjusted. For example, when all the N-channel field-effect transistors N1 to N5 are turned ON, and all the P-channel field-effect transistors P1 to P5 are turned OFF, the output voltage of the lower 5-bit conversion circuit becomes equal to the ground potential. Moreover, when the N-channel field-effect transistors N1 to N4 are turned ON, the N-channel field-effect transistor N5 is turned OFF, the P-channel field-effect transistors P1 to P4 are turned OFF, and the P-channel field-effect transistor P5 is turned ON, the output voltage becomes VDD/2. The ON/OFF control of the N-channel field-effect transistors N1 to N5 and the P-channel field-effect transistors P1 to P5 is performed by the control circuit 30A.

For example, when all the upper 7 bits are determined to be 0, the control circuit 30A causes all the switches SW10-1 to SW10-7 to be switched to the low potential power supply side and the switch SW10-8 to be switched to the lower 5-bit conversion circuit 120 side and successively switches ON/OFF the N-channel field-effect transistors N1 to N5 and the P-channel field-effect transistors P1 to P5, whereby the output voltage of the lower 5-bit conversion circuit 120 is switched to VDD/2, VDD/4 (or VDD×(¾)). In a state where all the switches SW10-1 to SW10$^{-7}$ are switched to the low potential power supply side, and the switch SW10-8 is switched to the lower 5-bit conversion circuit 120 side, the capacitive element C10-8 is disposed between the lower 5-bit conversion circuit 120 and the signal line L1, and the capacitive elements C10-1 to C10-7 are disposed between the signal line L1 and the low potential power supply, so that the comparison target voltage becomes ¹⁄₁₂₈ of the output voltage of the lower 5-bit conversion circuit 120. Therefore, by switching the output voltage of the lower 5-bit conversion circuit 120 to VDD/2, VDD/4 (or VDD×(¾)), it is possible to generate a comparison target voltage having a voltage value of VDD/256 (that is, a comparison target voltage for determining the bit value of the MSB of the lower 5 bits) and a comparison target voltage having a voltage value of VDD/512 (or VDD×(³⁄₅₁₂)) (that is, a comparison target voltage for determining the 2SB of the lower 5 bits).

As shown in FIG. 1, the reference voltage adjustment circuit 50A includes capacitive elements C20-n (n=1 to 8) and capacitive elements C30-n (n=1 to 8) each having one electrode connected to the signal line L2. As shown in FIG. 1, the other electrodes of the capacitive elements C20-n (n=1 to 8) are connected to the high potential power supply through switches SW20-n (n=1 to 8), and the other electrodes of the capacitive elements C30-n (n=1 to 8) are connected to the low potential power supply through switches SW30-n (n=1 to 8). The capacitance of each of these capacitive elements C20-n (n=1 to 8) and capacitive elements C30-n (n=1 to 8) is set to be binary-weighted as follows. That is, the capacitances of the capacitive elements C20-1 and C30-1 are 32C; the capacitances of the capacitive elements C20-2 and C30-2 are 16C; the capacitances of the capacitive elements C20-3 and C30-3 are 8C; the capacitances of the capacitive elements C20-4 and C30-4 are 4C; the capacitances of the capacitive elements C20-5 and C30-5 are 2C; the capacitances of the capacitive elements C20-6 and C30-6 are 1C; and the capacitances of the capacitive elements C20-7 and C20-8 and C30-7 and C30-8 are 0.5C.

The ON/OFF control of the switches SW20-n (n=1 to 8) and the switches SW30-n (n=1 to 8) is performed by the control circuit 30A. For example, when all the switches SW20-n (n=1 to 8) are turned ON, all the capacitive elements C20-n (n=1 to 8) are disposed in parallel between the high potential power supply and the signal line L2, and the total capacitance thereof will be 64C. Moreover, when only the switch SW20-1 is turned ON, and the switches SW20-2 to SW20-8 are turned OFF, only the capacitive element C20-1 will be disposed between the high potential power supply and the signal line L2. That is, the switches SW20-n (n=1 to 8) and the capacitive elements C20-n (n=1 to 8) function as a first variable capacitor which is disposed between the high potential power supply and the signal line L2. Similarly, the switches SW30-n (n=1 to 8) and the capacitive elements C30-n (n=1 to 8) function as a second variable capacitor which is disposed between the signal line L2 and the low potential power supply. The control circuit 30A of the present embodiment executes a process of adjusting the capacitances of the first and second variable capacitors (that is, a process of performing the ON/OFF control of the switches SW20-n (n=1 to 8) and the switches SW30-n (n=1 to 8)) so that the impedances of the signal lines L1 and L2 are uniform with each other in synchronism with the successive comparison operation (that is, the operation of switching the switches SW10-n (n=1 to 8), N-channel field-effect transistors N1 to N5, and P-channel field-effect transistors P1 to P5 of the local D/A converter circuit 10A). Although the details will be described later, by making the impedances of the signal lines L1 and L2 uniform with each other, it is possible to cancel the influence resulting from the fluctuation of the power supply voltage and prevent a decrease in the A/D conversion accuracy.

Hereinabove, the configuration of the A/D converter 1A has been described.

Next, the operation of the A/D converter 1A will be described.

In a stage where the input analog voltage $V_{in}$ is sampled and held, the control circuit 30A turns ON all the N-channel field-effect transistors 430, 440, and 450, connects all the switches SW10-n (n=1 to 8) to the analog input terminal CN1, and turns ON all the switches SW20-n (n=1 to 8) and SW30-n (n=1 to 8). In this way, the voltage appearing on the signal lines L1 and L2 is VDD/2, and the input analog voltage $V_{in}$ is converted to the internal analog voltage ($V_{in}$−VDD/2) and sampled and held (that is, electric charge corresponding to the internal analog voltage ($V_{in}$−VDD/2) is accumulated in the capacitive elements C10-n (n=1 to 8)). On the other hand, in the reference voltage adjustment circuit 50A, electric charge corresponding to the potential difference (VDD−VDD/2=VDD/2) between the high potential power supply and the signal line L2 is accumulated in each of the capacitive elements C20-n (n=1 to 8), and electric charge corresponding to the potential difference (VDD/2−0=VDD/2) between the signal line L2 and the low potential power supply is accumulated in each of the capacitive elements C30-n (n=1 to 8).

When a predetermined clock sampling period has passed from the start of sampling of the input analog voltage, the control circuit 30A turns OFF the N-channel field-effect transistors 440 and 450, causes the switches SW10-n (n=1 to 7) to be switched to the low potential power supply side and the switch SW10-8 to be switched to the lower 5-bit conversion circuit side, turns ON all the N-channel field-effect transistors N1 to N5, and turns OFF all the P-channel field-effect transistors P1 to P5. As a result, all the capacitive elements C10-n (n=1 to 8) of the local D/A converter circuit 10A are disposed in parallel between the signal line L1 and the low potential power supply, and the respective electric charge accumulated therein is held. That is, the local D/A converter circuit 10A functions as a sample/hold circuit that converts the input analog voltage $V_{in}$ to a potential difference "$V_{in}$−VDD/2" between the input analog voltage $V_{in}$ and the reference voltage VDD/2 and holds the potential difference. On the other hand, although the signal line L2 is disconnected from the common connection point of the resistors 410 and 420, the potential of the signal line L2 is maintained at VDD/2 by the electric charge charged to each of the capacitive elements C20-n (n=1 to 8) and C30-n (n=1 to 8).

Subsequently, the control circuit 30A performs successive comparison between the input voltage $V_{in}$ and the comparison target voltages. Specifically, the control circuit 30A causes only the switch SW10-1 of the switches SW10-n (n=1 to 8) to be switched to the high potential power supply side and compares the magnitudes of the input analog voltage $V_{in}$ and VDD/2.

Figure 6A:
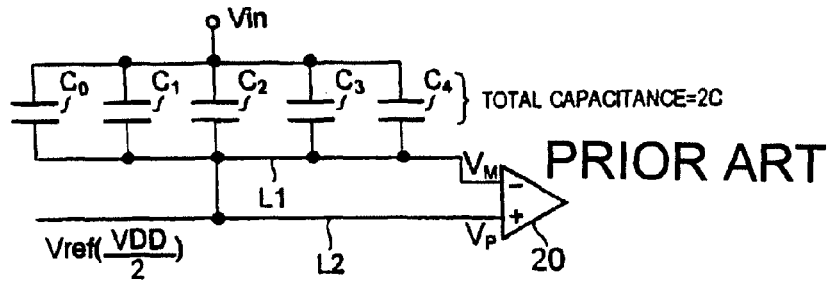
FIGS. 6A to 6D are diagrams illustrating the operation of a conventional successive approximation A/D converter.
Figure 6B:
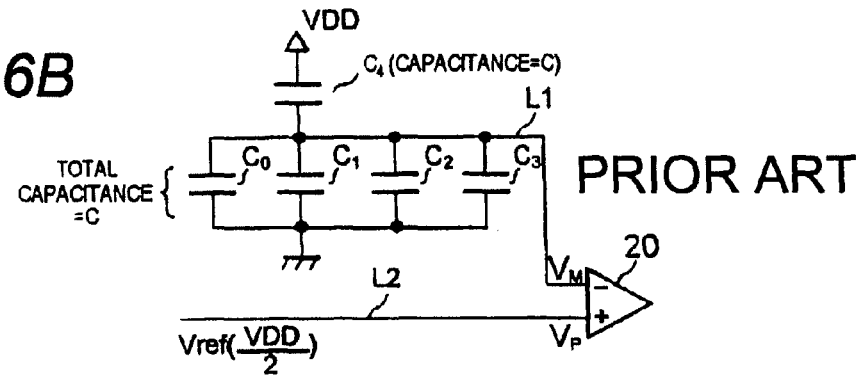
Figure 6C:
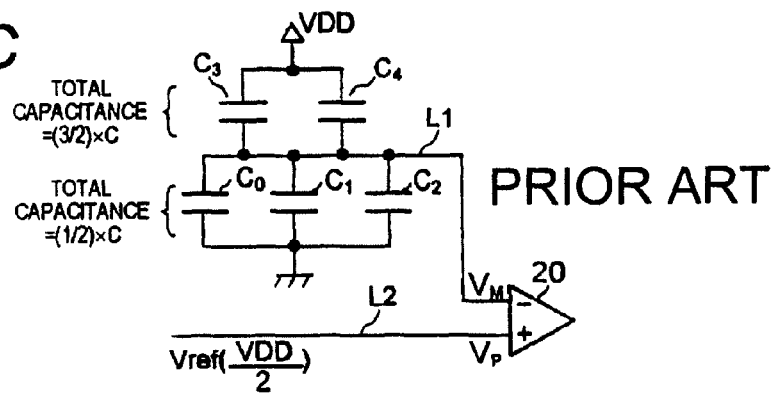
Figure 6D:
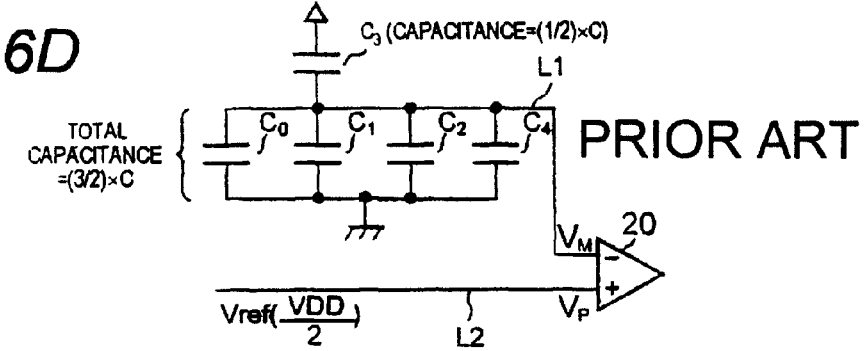

When only the switch SW10-1 is switched to the high potential power supply side, similarly to the case of FIG. 6B, the capacitance ratio between the capacitor disposed between the high potential power supply and the signal line L1 and the capacitor disposed between the signal line L1 and the low potential power supply is 1:1. On the other hand, since all the switches SW20-n (n=1 to 8) and SW30-n (n=1 to 8) are turned ON, the capacitance ratio between the capacitor disposed between the high potential power supply and the signal line L2 and the capacitor disposed between the signal line L2 and the low potential power supply becomes 1:1 (see (e) in FIG. 3).

If the input analog voltage $V_{in}$>VDD/2, in order to compare the magnitudes of the input analog voltage $V_{in}$ with VDD×(¾), the control circuit 30A causes the switch SW10-2 in addition to the switch SW10-1 to be switched to the high potential power supply side. On the other hand, if the input analog voltage $V_{in}$<VDD/2, in order to compare the magnitudes of the input analog voltage $V_{in}$ with VDD/4, the control circuit 30A causes the switch SW10-1 to be switched to the low potential power supply side and the switch SW10-2 to be switched to the high potential power supply side. In addition, the control circuit 30A performs the ON/OFF control of the switches SW20-n (n=1 to 8) and SW30-n (n=1 to 8) of the reference voltage adjustment circuit 50A in synchronism with the switching of the switches SW10-n (n=1 to 8). Hereinafter, the operation of the control circuit 30A when the input analog voltage $V_{in}$>VDD/2 will be described as an example.

As described above, when the input analog voltage $V_{in}$>VDD/2, the control circuit 30A causes the switch SW10-2 in addition to the switch SW10-1 to be switched to the high potential power supply side. In this way, in the local D/A converter circuit 10A, the capacitive elements C10-1 and C10-2 are disposed in parallel between the high potential power supply and the signal line L1, and the capacitive elements C10-3 to C10-8 are disposed in parallel between the signal line L1 and the low potential power supply. As a result, the output voltage of the local D/A converter circuit 10A (that is, the input voltage $V_M$ to the minus-side input terminal of the comparator 20) has a value given by Equation 3 below. The first term on the right side of Equation 3 is a component obtained by dividing the potential difference between the high potential power supply and the low potential power supply at a ratio of 3:1 (the ratio of the total capacitance of the capacitive elements C10-1 and C10-2 and the total capacitance of the capacitive elements C10-3 to C10-8), and the second term on the right side is a component attributed to the electric charge accumulated in the capacitive elements C10-n (n=1 to 8).

$$V_M = VDD \times (¾) - (V_{in} - VDD/2) \qquad (3)$$

In addition, the control circuit 30A performs the ON/OFF control of the switches SW20-n (n=1 to 8) and SW30-n (n=1 to 8) so that the impedances of the signal lines L1 and L2 are uniform with each other (that is, as shown by (b) in FIG. 3, the capacitance ratio between the capacitor disposed between the high potential power supply and the signal line L2 and the capacitor disposed between the signal line L2 and the low potential power supply becomes 3:1), in synchronism with the switching of the switch SW10-2. For example, in synchronism with the switching of the switch SW10-2, the switches SW20-7 and 20-8 are turned OFF, and the switches SW30-1, SW30-3, SW30-5, SW30-7, and SW30-8 are turned OFF.

Here, it will be assumed that the output voltage of the high potential power supply is changed from VDD to VDD+ΔV. If so, then the output voltage $V_M$ of the local D/A converter circuit 10A has a value given by Equation 4 below. As described above, the first term on the right side is a component obtained by dividing the potential difference between the high potential power supply and low potential power supply at a ratio of 3:1, and the fluctuation component of the power supply voltage appears on this first term on the right side.

$$V_M = (VDD + \Delta V) \times (¾) - (V_{in} - VDD/2) \qquad (4)$$

On the other hand, the input voltage $V_P$ to the plus-side input terminal of the comparator 20 (that is, the potential of the signal line L2) is given as follows. As shown by (b) in FIG. 3, in a state where the capacitance of the first variable capacitor disposed between the high potential power supply and the signal line L2 is 63C, and the capacitance of the second variable capacitor disposed between the signal line L2 and the low potential power supply is 21C, the quantity of the electric charge accumulated in the first variable capacitor is given by $63C \times \{VDD+\Delta V-V_P\}$, and the quantity of the electric charge accumulated in the second variable capacitor is given by $21C \times V_P$. Assuming that negative electric charge is accumulated in an electrode of the first capacitor connected to the signal line L2, and positive electric charge is accumulated in an electrode of the second capacitor connected to the signal line L2, the law of conservation of charge is applied as given by Equation 5 below.

$$-63C \times VDD/2 + 21C \times VDD/2 = -63C \times \{VDD+\Delta V-V_P\} + 21C \times V_P \quad (5)$$

Solving Equation 5 results in $V_P = VDD/2 + \Delta V \times (3/4)$. In this way, in the present embodiment, even when the output voltage of the high potential power supply fluctuates, fluctuation components having the same magnitudes are contained in the voltages input to the plus-side input terminal and the minus-side input terminal of the comparator 20. Therefore, the fluctuation components are canceled by the comparator 20, and the magnitudes of the input analog voltage $V_{in}$ and the comparison target voltages can be compared accurately. When the comparison target voltage is VDD/4, the control circuit 30A may perform the ON/OFF control of the switches SW20-n (n=1 to 8) and SW30-n (n=1 to 8) so as to realize a voltage division ratio as shown by (e) in FIG. 3 (namely, 1:3). Similarly, the control circuit 30A may perform the ON/OFF control of the switches SW20-n (n=1 to 8) and SW30-n (n=1 to 8) so as to realize a voltage division ratio as shown by (c) in FIG. 3 (namely, 7:1) when the comparison target voltage is VDD×(7/8), a voltage division ratio as shown by (d) in FIG. 3 (namely, 5:3) when the comparison target voltage is VDD×(5/8), a voltage division ratio as shown by (f) in FIG. 3 (namely, 3:5) when the comparison target voltage is VDD×(3/8), and a voltage division ratio as shown by (g) in FIG. 3 (namely, 1:7) when the comparison target voltage is VDD/8, respectively.

Here, various means can be considered as specific means for allowing the control circuit 30A to perform the ON/OFF control of the switches SW20-n (n=1 to 8) and SW30-n (n=1 to 8) so as to realize the voltage division ratios shown by (a) to (g) in FIG. 3 in synchronism with the switching control with respect to the local D/A converter circuit 10A. One example of such means may be configured as follows. First, a table in which a control pattern data representing which one of the switches SW20-n (n=1 to 8) and SW30-n (n=1 to 8) is turned ON or OFF is stored so as to correspond to a bit pattern corresponding to the respective comparison target voltages (the bit pattern representing the content stored in a successive approximation register when the comparison target voltage is generated) is stored in the control circuit 30A. Thereupon, the control circuit 30A may be caused to perform a process of reading from the table control pattern data corresponding to the content stored in the successive approximation register when switching control is performed on the local D/A converter circuit 10A in accordance with the content stored in the successive approximation register and perform the ON/OFF control of the switches SW20-n (n=1 to 8) and SW30-n (n=1 to 8) in accordance with the control pattern data.

In this way, according to the A/D converter 1A of the present invention, even when the power supply voltage VDD fluctuates, the fluctuation component thereof can be canceled by the comparator 20, and the A/D conversion can be performed with high accuracy. Therefore, it is possible to use a power supply the output voltage of which fluctuates such as a switching power supply and a DC/DC converter as a generation source of the reference voltage VDD and suppress the output voltage VDD thereof so as to be low.

B: Other Embodiments

While the first embodiment of the present invention has been described, the embodiment of the present invention is not limited to this, but various aspects given below may be considered.

(1) FIG. 4 is a block diagram showing a configuration example of an A/D converter 1B according to a second embodiment of the present invention. As can be understood from comparison between FIGS. 1 and 4, the A/D converter 1B is different from the A/D converter 1A in that the control circuit 30A is replaced with a control circuit 30B, and the reference voltage adjustment circuit 50A is replaced with a reference voltage adjustment circuit 50B.

Hereinafter, only the points of difference will be described.

As shown in FIG. 4, in the reference voltage adjustment circuit 50B, a y×C capacitive element C40 is disposed between the high potential power supply and the signal line L2, and a (128−y)×C capacitive element C50 is disposed between the signal line L2 and the low potential power supply (where y is a predetermined value ranging from 0 to 128). Since the capacitances of the capacitive elements C40 and C50 are fixed, the control circuit 30B just performs the ON/OFF control of various switches included in the local D/A converter circuit 10A during the successive comparison operation, which is the point of difference from the control circuit 30A.

Here, various aspects can be considered with regard to what values will have the specific capacitances of the capacitive elements C40 and C50. For example, an aspect where y=64, an aspect where y=32 or y=96, and the like may be possible. When y=64, the capacitance of the capacitive element C40 is 64C, and the capacitance of the capacitive element C50 is also 64C. This is uniform with the capacitance distribution (see (a) in FIG. 3) used when comparing the magnitudes of the input analog voltage $V_{in}$ and VDD/2 in the first embodiment described above. Moreover, when y=32, the capacitance of the capacitive element C40 is 32C, and the capacitance of the capacitive element C50 is 96C. That is, when y=32, the ratio of the capacitance of the capacitive element C40 to the capacitance of the capacitive element C50 is 1:3, and this is uniform with the capacitance distribution (see (e) in FIG. 3) used when comparing the magnitudes of the input analog voltage $V_{in}$ and VDD/4. Moreover, when y=96, the ratio of the capacitance of the capacitive element C40 to the capacitance of the capacitive element C50 is 3:1, and this is uniform with the capacitance distribution (see (b) in FIG. 3) used when comparing the magnitudes of the input analog voltage $y_{in}$ and VDD×(3/4).

For example, if it is determined that y=64, the fluctuation component when comparing the magnitudes of the input analog voltage $V_{in}$ and VDD/2 can be canceled by the comparator 20. However, the fluctuation component of the power supply voltage is not canceled by the comparator 20 when the magnitudes of the input analog voltage $V_{in}$ and VDD/4 are compared or when the magnitudes of the input analog voltage $V_{in}$ and VDD×(3/4) are compared. As will be understood from comparison between FIGS. 1 and 4, the A/D converter 1B is advantageous in that the circuit configuration of the reference voltage adjustment circuit 50B is simplified, the design and manufacturing thereof is easier than the A/D converter 1A, and the circuit dimensions thereof are small. However, the A/D converter 1B is disadvantageous in that the fluctuation component ΔV of the power supply voltage can only be canceled near a predetermined specific code (near "100 . . . 0" if y=64 and near "010 . . . 0" if y=32), and high conversion accuracy is not obtained for other codes. Therefore, when designing and manufacturing an electronic circuit having the A/D converter according to the present invention, it may be helpful to select a preferable one of the A/D converters 1A and 1B in accordance with the requirements of that electronic circuit. For example, when high conversion accuracy is required over the entire range, the A/D converter 1A may be used preferably. In contrast, when high conversion accuracy is required only near a specific code but not for other codes, and miniaturization of the circuit and a reduction in the design and manufacturing costs are required, the A/D converter 1B may be used. In this case, the capacitances of the capacitive elements C40 and C50 may be determined in accordance with the value of the specific code.

(2) In the first and second embodiments described above, although the local D/A converter circuit 10A is configured using the charge redistribution-type circuit and the resistance division-type circuit, the local D/A converter circuit 10A may be configured using any one of the charge redistribution-type circuit and the resistance division-type circuit.

What is claimed is:

1. A successive approximation A/D converter, comprising:
a reference voltage generation circuit that divides a potential difference between a high potential power supply and low potential power supply to output a reference voltage;
a sample/hold circuit that converts an input analog voltage to an internal analog voltage representing a difference between the input analog voltage and the reference voltage, and samples and holds the internal analog voltage;
a D/A converter circuit that divides a potential difference between the high potential power supply and the low potential power supply to generate a comparison target voltage;
a comparator that compares the input analog voltage with the comparison target voltage and outputs a signal representing the result of the comparison; and
a control circuit that retrieves a comparison target voltage that is closest to the input analog voltage while successively updating a voltage division ratio in the D/A converter circuit in accordance with the output signal from the comparator and outputs a digital value corresponding to the result of the retrieval, wherein
a potential difference between the comparison target voltage generated by the D/A converter circuit and the internal analog voltage is applied to one input terminal of the comparator through a first signal line, and the reference voltage generation circuit is connected to the other input terminal of the comparator through a second signal line and a switching element,
a first capacitive element is disposed between the high potential power supply and the second signal line, and a second capacitive element is disposed between the second signal line and the low potential power supply,
the control circuit turns ON the switching element to charge the first and second capacitive elements during a period when the sample/hold circuit samples and holds the internal analog voltage and turns OFF the switching element in response to the end of the period,
a first switch is disposed between the first capacitive element and the high potential power supply,
a second switch is disposed between the second capacitive element and the low potential power supply,
the D/A converter includes a plurality of third capacitive elements, each of which has one end connected to the first signal line and the other end connected to a respective one of a plurality of third switches that is provided to select any one of at least the high potential power supply and the low potential power supply, and
turning ON and OFF the first switch and the second switch is controlled to adjust each capacitance of the first capacitive element and the second capacitive element so that impedances of the first and second signal lines are uniform with each other.

2. The successive approximation A/D converter according to claim 1, wherein
both the first and second capacitive elements are variable capacitive elements, and
the control circuit adjusts the capacitances of the first and second capacitive elements so that a voltage division ratio determined by the first and second capacitive elements is uniform with a voltage division ratio used when the D/A converter circuit generates the comparision target voltage.

3. The successive approximation A/D converter according to claim 2, wherein
the first and second capacitive elements each comprise a plurality of capacitive elements, each capacitance of the plurality of capacitive elements being different from one another, and
the control circuit adjusts total capacitances of the first and second capacitive elements by switching the plurality of capacitive elements.

4. The successive approximation A/D converter according to claim 2, wherein
the control circuit adjusts the capacitances of the first and second capacitive elements by switching the respective first and second switches connected to the capacitive elements in synchronism with a successive comparison operation of the D/A converter circuit.

* * * * *